(12) United States Patent
Renz

(10) Patent No.: US 7,053,620 B2
(45) Date of Patent: May 30, 2006

(54) MAGNETIC RESONANCE SYSTEM WITH A LOCAL COIL PIVOTABLY MOUNTED IN AN EXAMINATION TUNNEL

(75) Inventor: Wolfgang Renz, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/859,377

(22) Filed: Jun. 2, 2004

(65) Prior Publication Data

US 2005/0012502 A1    Jan. 20, 2005

(30) Foreign Application Priority Data

Jun. 2, 2003    (DE)    ................................ 103 24 870

(51) Int. Cl.
*G01V 3/00*    (2006.01)
(52) U.S. Cl. ...................................................... 324/318
(58) Field of Classification Search ................ 324/318; 600/410
See application file for complete search history.

(56) References Cited

U.S. PATENT DOCUMENTS

| | | | |
|---|---|---|---|
| 4,891,596 A | | 1/1990 | Mitomi |
| 5,150,710 A | | 9/1992 | Hall et al. |
| 5,197,474 A | * | 3/1993 | Englund et al. ............ 600/415 |
| 5,473,251 A | * | 12/1995 | Mori ........................... 324/318 |
| 5,519,321 A | | 5/1996 | Hagen et al. |
| 5,617,027 A | | 4/1997 | Decke |
| 6,346,814 B1 | * | 2/2002 | Carrozzi et al. ............. 324/318 |
| 6,466,018 B1 | * | 10/2002 | Dumoulin et al. .......... 324/318 |
| 6,504,369 B1 | * | 1/2003 | Varjo et al. .................. 324/318 |
| 6,529,004 B1 | * | 3/2003 | Young ......................... 324/318 |
| 6,529,764 B1 | * | 3/2003 | Kato et al. ................... 600/411 |
| 6,586,934 B1 | * | 7/2003 | Biglieri et al. .............. 324/309 |
| 6,801,038 B1 | * | 10/2004 | Carrozzi et al. ............. 324/318 |
| 2002/0138001 A1 | | 9/2002 | Kroeckel |
| 2004/0220468 A1 | * | 11/2004 | Watkins et al. .............. 600/410 |

FOREIGN PATENT DOCUMENTS

| | | | |
|---|---|---|---|
| DE | 36 28 035 | | 2/1988 |
| JP | 3-231634 | * | 3/1991 |

* cited by examiner

*Primary Examiner*—Diego Gutierrez
*Assistant Examiner*—Dixomara Vargas
(74) *Attorney, Agent, or Firm*—Schiff Hardin LLP

(57) ABSTRACT

A magnetic resonance system has a transport element and an examination tunnel with an inner tunnel contour and a tunnel axis. An examination subject can be inserted into the examination tunnel in the direction of the tunnel axis by means of the transport element. At least one local coil that exhibits an outer coil contour (viewed in cross-section relative to the tunnel axis) and that can be pivoted around a base pivot axle, so as to be adjusted to the examination subject, is disposed in the examination tunnel. The base pivot axle is disposed at the edge of the examination tunnel and runs parallel to the tunnel axis.

14 Claims, 3 Drawing Sheets

MAGNETIC RESONANCE SYSTEM WITH A LOCAL COIL PIVOTABLY MOUNTED IN AN EXAMINATION TUNNEL

BACKGROUND OF THE INVENTION

1. Field of the Invention

The present invention concerns a magnetic resonance system of the type having a transport element and an examination tunnel with an inner tunnel contour and a tunnel axis, wherein an examination subject can be inserted into the examination tunnel in the direction of the tunnel axis by means of the transport element, and wherein at least one local coil that exhibits an outer coil contour (viewed in cross-section relative to the tunnel axis) is disposed in the examination tunnel and can be pivoted around a first pivot axle, and thus can be adjusted to the examination subject.

2. Description of the Prior Art

A magnetic resonance system of this type is known from German OS 36 28 035. In this publication, the attachment of the local coil on or in the examination tunnel is mentioned incidentally, without further explanations.

From German OS 101 14 013, a magnetic resonance system with a transport element and an examination tunnel with a tunnel axis is known in which an examination subject can be inserted into the examination tunnel in the direction of the tunnel axis by means of the transport element. At least one local coil that can be adjusted to the examination subject is arranged in the examination tunnel.

From German PS 38 19 541, a magnetic resonance system with a transport element and an examination tunnel with a tunnel axis also is known in which an examination subject can be inserted into the examination tunnel in the direction of the tunnel axis by means of the transport element. Local coils that can be adjusted to the examination subject are carried on the transport element by flexible arms.

A similar disclosure is provided by U.S. Pat. No. 5,150,710.

A magnetic resonance system with a transport element and an examination tunnel with a tunnel axis is known from German Utility Model 94 07 802, in which an examination subject can be inserted into the examination tunnel in the direction of the tunnel axis by means of the transport element. The local coil can be attached to a stand that can be attached to the transport element in a groove running parallel to the tunnel axis.

From German PS 43 18 134, antenna arrangements for a magnetic resonance system are known in which the antenna arrangements have a first coil and second coil. The first coil is thereby arranged mobile, such that, in a first position, it inclusively encloses at least one part of an opening of the second coil and, in a second position, uncovers the at least one opening of the second coil so that the examination subject can be introduced into the second coil. The antenna arrangements known from German PS 43 18 134 are thereby alternatively fashioned as head, knee or foot antennas.

In the fashioning as a head antenna, the antenna arrangement appears to be arranged on a patient bed, by means of which the patient can be inserted into an examination region of the magnetic resonance system. In the embodiments as a knee or foot antenna, the antenna arrangement appears to be applied directly on the body of the patient.

A flexible local coil for magnetic resonance applications is known from German OS 195 09 020.

These known magnetic resonance systems operate quite satisfactorily, but the local coils require a relatively large space, or are arranged quite far from the examination subject. They therefore excessively narrow restrict or encumber the examination tunnel and/or enable only a sub-optimal improvement of the reception of the magnetic resonance signals

SUMMARY OF THE INVENTION

An object of the present invention is to provide a magnetic resonance system of the initially described type, wherein the local coil is disposed in the examination tunnel, and can be adjusted to the examination subject, but nevertheless occupies only a slight space in the examination tunnel.

The object is achieved by a magnetic resonance system of the type initially described wherein the first base pivot axle is disposed on the edge of the examination tunnel and is parallel to the tunnel axis.

In an embodiment wherein the outer coil contour is adapted, or can be adapted, to the inner tunnel contour such that the local coil can be internally adjusted to the examination tunnel over its entire surface, the local coil requires particularly little space in the state when it is not adjusted to the examination subject.

The transport element can have an upper edge facing the tunnel axis, and the base pivot axle can be disposed at the height of the upper edge or can be disposed slightly above it. In particular, this allows the local coil to be particularly well adjusted to the examination subject The first base pivot axle can be a hollow-cylinder, so it exhibits a relatively low weight. This embodiment offers still further advantages discussed below.

One of the advantages is that it is possible in this case to arrange a connection cable inside the pivot axle to connect the local coil with a control device.

The outer coil contour of the local coil can be invariable, but it is preferably variable. The variability can be achieved, for example, by the local coil having an initial section and a continuation section. The initial section abuts the base pivot axle on one side and the continuation section on the other side, and the continuation section can be pivoted around a secondary pivot axle (that is disposed between the initial section and the continuation section and is parallel to the tunnel axis) relative to the initial section in order to vary the outer coil contour.

An embodiment wherein the contour is variable, and wherein the base pivot axle is a hollow cylinder, allows the contour to be variable by means of mechanical displacement (shift) elements which are disposed inside the base pivot axle.

In the minimal configuration of the present invention, only one such local coil is arranged in the examination tunnel. At least one second local coil that can be pivoted around a second base pivot axle (and can thus be adjusted to the examination subject) preferably is also disposed in the examination tunnel. The second base pivot axle is also disposed on the edge of the examination tunnel and runs parallel to the tunnel axis.

The second local coil can be disposed behind the first local coil (viewed in the direction of the tunnel axis). In this case, the second base pivot axle preferably is aligned with the first base pivot axle. Given design of the first base pivot axle as a hollow cylinder, the second base pivot axle can be disposed inside the first base pivot axle.

It is also possible that the local coils and the base pivot axles are arranged symmetrically relative to a perpendicular plane containing the tunnel axis.

Given more than two local coils, the embodiments described above can be combined. Preferably, however, the local coils are fashioned identically, one behind the other and/or next to one another.

DESCRIPTION OF THE PREFERRED EMBODIMENTS

Figure 1:
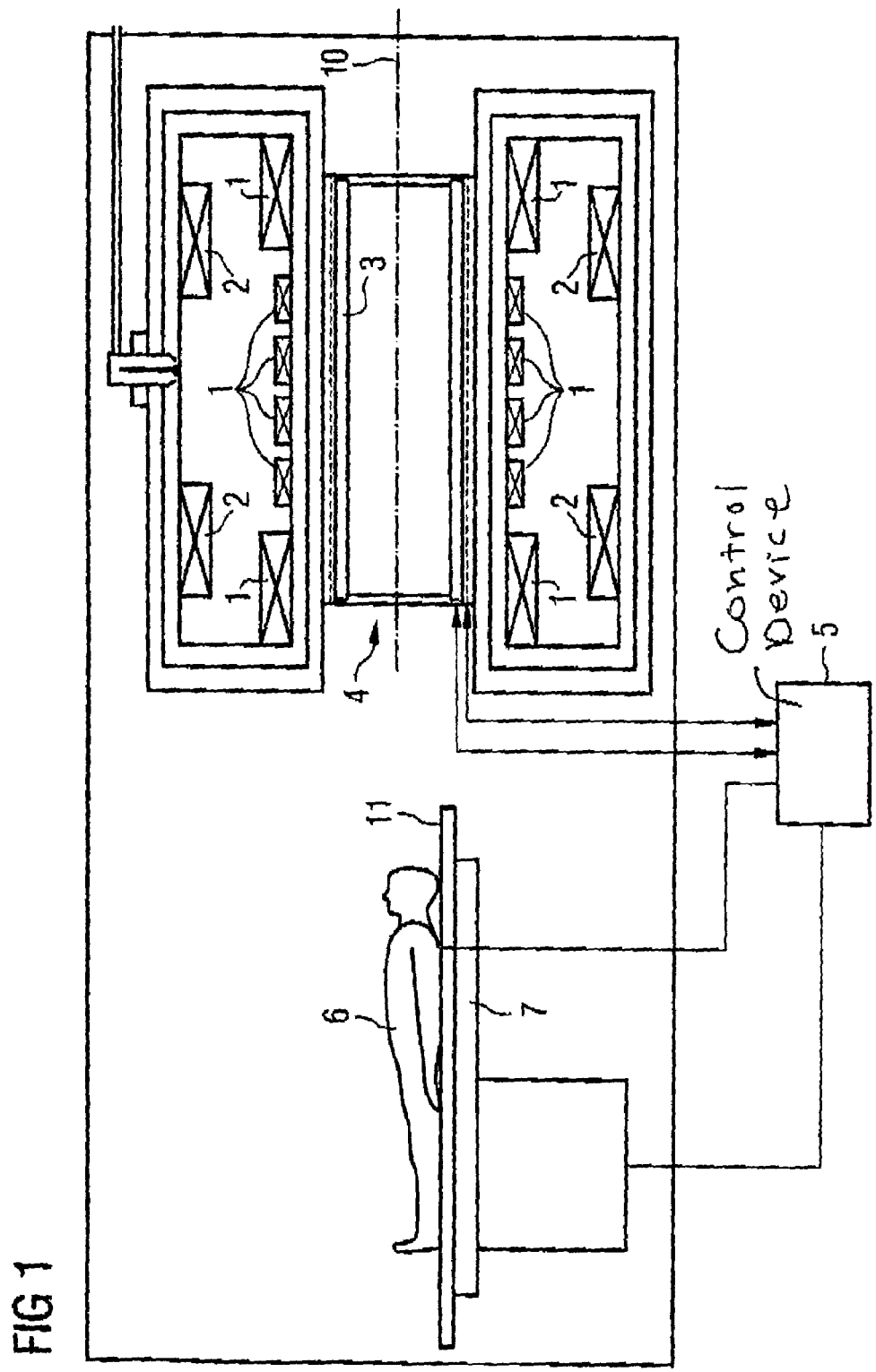
FIG. 1 schematically illustrates a magnetic resonance system, in which a local coil arrangement in accordance with the invention are based.

As shown in FIG. 1, a magnetic resonance system has a magnet arrangement. The magnet arrangement comprises, among other things, a basic field magnet 1, a shielding magnet 2, a gradient coil arrangement (not shown), and an outer antenna arrangement 3.

The basic field magnet 1 generates a homogenous, time-constant basic magnetic field in the examination tunnel 4. The examination tunnel 4 has an inner tunnel contour that generally is circular.

The outer antenna arrangement 3 can be controlled by a control device 5 such that it generates a homogenous, radio-frequency magnetic resonance excitation field in the examination tunnel 4. An examination subject 6—normally a human—can therefore be excited to magnetic resonance when Introduced into the examination tunnel 4.

Spatial coding of the excited magnetic resonances ensues in a known manner by means of the gradient coil arrangement. The control of the gradient coil arrangement also ensues via the control device 5.

The shielding magnet 3 confines the basic magnetic field of the base magnet 1 from proceeding outwardly.

As can be seen In FIG. 1, the examination subject 6 can be inserted into and extracted from the examination tunnel 4 in the direction of a tunnel axis 10 by means of a transport element 7 (a patient bed). The transport element 7 is guided by guide elements (for example, slide rails) that are arranged or attached in the examination tunnel 4. They are not shown for clarity.

Due to the size of the outer antenna arrangement 3, magnetic resonance signals can be received by it only with relatively low spatial resolution, and primarily only with a relatively low signal-to-noise ratio.

Figure 2:
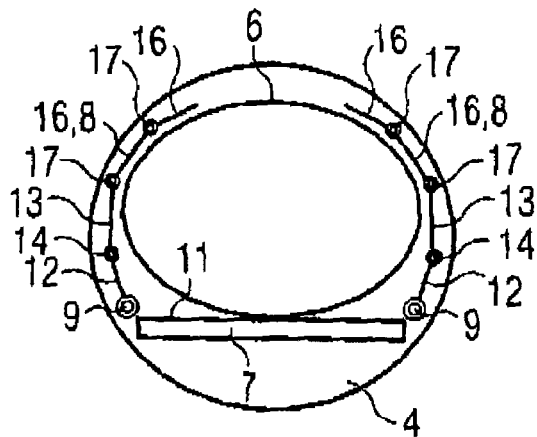
FIG. 2 through 4 a plan view of an examination tunnel in the direction of a tunnel axis, for various embodiments of the Invention.

In order to improve the signal-to-noise ratio in the received magnetic resonance signals, according to FIG. 2 local coils 8 are arranged in the examination tunnel 4. The local coils 8 can be pivoted around base pivot axles 9 and thus be adjusted to the examination subject 6. They are fashioned identically.

Figure 3:
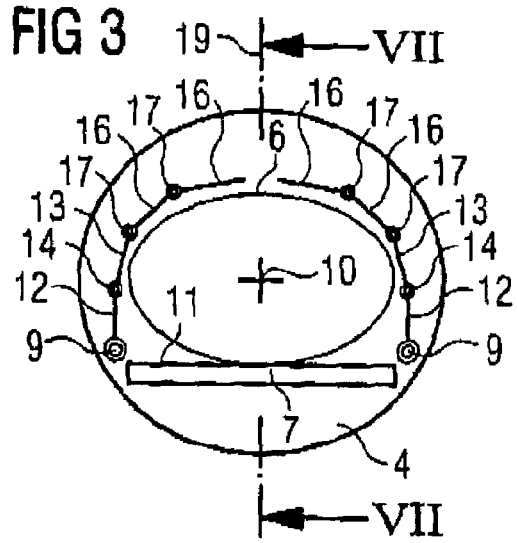
Figure 4:
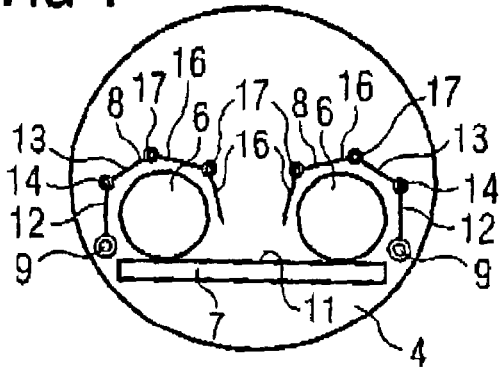

According to FIG 2 through 4, the base pivot axles 9 are arranged at the end of the examination tunnel 4. They run parallel to the tunnel axis 10 that is in turn the central axis of the examination tunnel 4.

According to FIG. 2 through 4, the transport element 7 has an upper edge 11 that faces the tunnel axis 10. According to FIG. 2 through 4, the base pivot axles 9 are arranged at the height of the upper edge 11 or slightly above the upper edge 11.

In FIG. 2, a state is shown in which the local coils 8 are internally adjusted to the examination tunnel 4. This state is assumed, for example, when the examination subject 6 is relatively large, thus when, for example, a relatively corpulent person 6 is to be examined. It is also assumed when other local coils (for example a head coil) are applied on the examination subject 6, or the magnetic resonance system is in the standby state, or no examination subject 6 is located in the examination tunnel 4.

The local coils 8 exhibit a curved outer coil contour in cross-section (viewed relative to the tunnel axis 10). The outer coil contour is adapted to the inner tunnel contour such that the local coils can be adjusted to the examination tunnel 4 not only at points, but rather over the entire surface.

The examination subject 6 is smaller in the representation according to FIG. 3 than in the representation according to FIG. 2. Given this smaller examination subject 6, the local coils 8 still are adjusted to the examination subject 6, but the outer coil contour of the local coils 8 is as such the same as in the representation according to FIG. 2.

Figure 5:
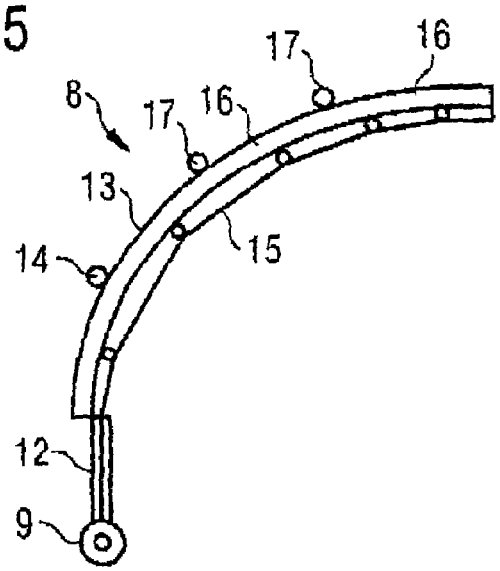
FIG. 5 is a perspective view of a local coil in accordance with the invention.

The examination subject 6 is even smaller in the representation of FIG. 4. In this case, for example, the leg of a person 6 is to be examined. In the representation according to FIG. 4, the outer coil contour of the local coils 8 is therefore varied with regard to the original outer coil contour according to FIGS. 2 and 3. The variation of the outer coil contour ensues as is subsequently specified in connection with FIGS. 4 and 5:

A shown in FIGS. 4 and 5, each local coil has an initial section 12 and a continuation section 13. The initial section 12 abuts the base pivot axles 9 on one side and one of the continuation section 13 on the other side. Secondary additional pivot axles 14 are present in the boundary region between the initial section 12 and the continuation section 13. The secondary pivot axles 14 thus are disposed between the initial section 12 and the continuation section 13. They run—just like the base pivot axles 9—parallel to the tunnel axis 10.

To vary the outer coil contour of each local coil 8, the continuation section 13 are pivoted around the secondary pivot axles 14 relative to the initial section 12. This can ensue, for example, by forces exerted on the continuation section 13 by a mechanical displacement element 15. The displacement element 15, for example, can be fashioned as known Bowden cables.

Figure 6:
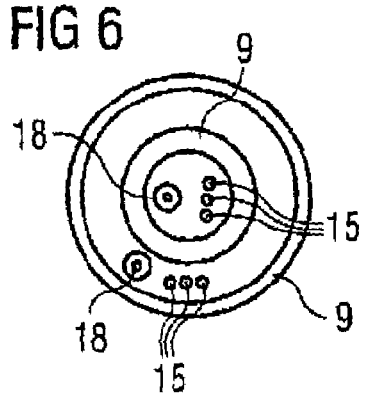
FIG. 6 is a cross-section through the base pivot axle of a local coil in accordance with the invention.

The principle stated above naturally can be repeated multiple times. It is thus possible for each local coil 8 to have a further continuation section 16, with secondary pivot axles 14, 17 between each two continuation sections 13, 16. A dedicated displacement element 15 can be present for each secondary pivot axle 14, 17, as shown in FIG. 6. Alternatively, a single displacement element 15 common to all secondary pivot axles 14, 17 can be used for each local coil 8.

Due to the displacement of the local coils 8 by means of the mechanical displacement elements 15, it is possible not only to provide manual or motorized drives for the base pivot axles 9, but rather to also arrange manual or motorized drives for the secondary pivot axles 14, 17 outside of the examination tunnel 4. The number of the displacement elements 15 to be directed outwardly can be kept relatively low, because only an increase of the curvature of the local coils 8 must be actively effected, while a reset is preferably effected by the inherent elasticity of each local coil 8.

According to FIG. 6, the base pivot axles 9 are fashioned as hollow cylinders. This makes it possible to dispose the mechanical displacement elements 15 inside the base pivot axles 9, thus to guide these out of the examination tunnel 4 inside the base pivot axles 9. Connection cables 18 to connect the local coils 8 with the control device 5 also be can arranged inside the base pivot axles 9 in this case.

Figure 7:
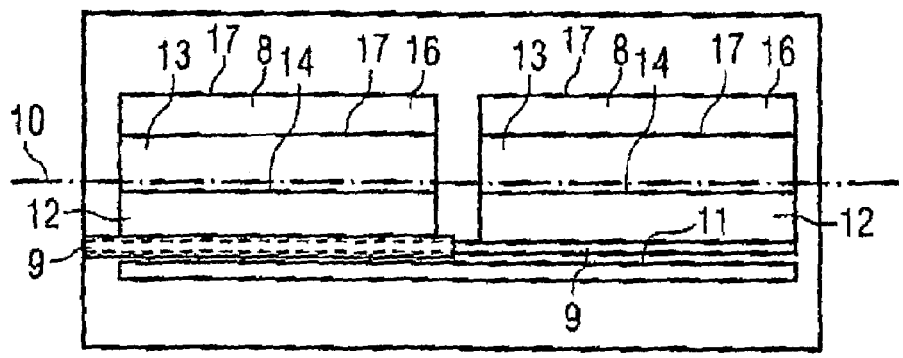
FIG. 7 is a section through the examination tunnel of FIG. 2 through 4 along the plane VII—VII in FIG. 3.

In the embodiment according to FIG. 2 through 4, the local coils 8 and the base pivot axles 9 are disposed symmetrically with one another relative to a plane 19. The plane 19 runs perpendicular and includes the tunnel axis 10. Alternatively or additionally, it is possible (as shown in FIG. 7) for the local coils 8 to be arranged one behind the other (viewed in the direction of the tunnel axis 10). In this case, the base pivot axles 9 of the respective local coils 8 preferably are aligned with one another. The base pivot axles 9 can thereby be displaced independent of one another. Given the design of the front base pivot axle 9 as a hollow cylinder, the rear base pivot axle 9 can be arranged inside the front base pivot axle 9. This is also shown in FIG. 6.

Using the inventive magnetic resonance system, magnetic resonance exposures with a good signal-to-noise ratio can be achieved in a simple manner without excessively restricting the examination tunnel 4, and without having to directly apply many local coils to the examination subject 6.

Although modifications and changes may be suggested by those skilled in the art, it is the intention of the inventor to embody within the patent warranted hereon all changes and modifications as reasonably and properly come within the scope of his contribution to the art.

I claim as my invention:

1. A magnetic resonance apparatus comprising:
   a magnetic resonance scanner having an examination tunnel extending along a tunnel axis and having an inner tunnel contour around said tunnel axis;
   a transport element adapted to receive an examination subject thereon, said transport element being movable into and out of the examination tunnel in a direction parallel to said tunnel axis while the examination subject is on said transport element;
   a local coil having an outer coil contour, viewed in cross-section relative to said tunnel axis; and
   a base pivot axis element disposed at an edge of the examination tunnel and for mounting said local coil in said examination tunnel and allowing pivoting of said local coil in said examination tunnel around a base pivot axis proceeding parallel to said tunnel axis, to adjust a position of said local coil relative to said examination subject.

2. A magnetic resonance apparatus as claimed in claim 1 wherein said outer coil contour of said local coil is adapted to said inner tunnel contour allowing said local coil to be adjusted relative to the examination tunnel over an entirety of the surface of the local coil.

3. A magnetic resonance apparatus as claimed in claim 2 wherein said outer coil contour of said local coil is variable.

4. A magnetic resonance apparatus as claimed in claim 3 wherein said local coil comprises an initial section and a continuation section, said initial section abutting said base pivot axis element at a first side thereof and abutting said continuation section at an opposite side thereof, and a secondary pivot axis element disposed between said initial section and said continuation section and proceeding parallel to said tunnel axis for allowing said continuation section to be pivoted relative to said initial section for varying said outer coil contour.

5. A magnetic resonance apparatus as claimed in claim 4 wherein said base pivot axis element is a hollow cylinder, and comprising a mechanical displacement element disposed in said hollow cylinder of said base pivot axis element for varying said outer coil contour.

6. A magnetic resonance apparatus as claimed in claim 1 wherein said transport element has an upper edge facing said tunnel axis, and wherein said base pivot axis element is disposed substantially at a height of said upper edge.

7. A magnetic resonance apparatus as claimed in claim 1 wherein said base pivot axis element is a hollow cylinder.

8. A magnetic resonance apparatus as claimed in claim 7 comprising a connection cable electrically connected to said local coil and proceeding inside of said hollow cylinder forming said base pivot axis element.

9. A magnetic resonance apparatus as claimed in claim 1 wherein said local coil is a first local coil and wherein said base pivot axis element is a first base pivot axis element, and comprising a second local coil disposed in said examination tunnel and mounted on a second base pivot axis element disposed at an edge of the examination tunnel, said second base pivot axis element proceeding parallel to said tunnel axis and allowing said second local coil to be pivoted around said second base pivot axis element to adjust a position in said examination tunnel of said second local coil relative to said examination subject.

10. A magnetic resonance apparatus as claimed in claim 9 wherein said second local coil is disposed behind said local is disposed along the direction of the tunnel axis.

11. A magnetic resonance apparatus as claimed in claim 10 wherein said second base pivot axis element is aligned with said first base pivot axis element.

12. A magnetic resonance apparatus as claimed in claim 9 wherein said first base pivot axis element is a hollow cylinder, and wherein the second base pivot axis element is disposed inside the hollow cylinder of the first base pivot axis element.

13. A magnetic resonance apparatus as claimed in claim 9 wherein said first and second local coils and said first and second base pivot axis elements are disposed symmetrically relative to a perpendicular plane containing said tunnel axis.

14. A magnetic resonance apparatus as claimed in claim 9 wherein said first and second local coils are identical.

* * * * *